(12) United States Patent
Lin

(10) Patent No.: US 10,535,621 B2
(45) Date of Patent: Jan. 14, 2020

(54) METHOD FOR PREPARING A SEMICONDUCTOR PACKAGE

(71) Applicant: NANYA TECHNOLOGY CORPORATION, New Taipei (TW)

(72) Inventor: Po-Chun Lin, Changhua (TW)

(73) Assignee: NANYA TECHNOLOGY CORPORATION, Taoyuan (TW)

(*) Notice: Subject to any disclaimer, the term of this patent is extended or adjusted under 35 U.S.C. 154(b) by 0 days.

(21) Appl. No.: 16/185,804

(22) Filed: Nov. 9, 2018

(65) Prior Publication Data

US 2019/0081018 A1 Mar. 14, 2019

Related U.S. Application Data

(62) Division of application No. 15/397,044, filed on Jan. 3, 2017, now Pat. No. 10,192,841.

(51) Int. Cl.
| | |
|---|---|
| *H01L 23/31* | (2006.01) |
| *H01L 25/065* | (2006.01) |
| *H01L 23/00* | (2006.01) |
| *H01L 21/56* | (2006.01) |

(52) U.S. Cl.
CPC ............ *H01L 24/16* (2013.01); *H01L 21/565* (2013.01); *H01L 23/3107* (2013.01); *H01L 23/3114* (2013.01); *H01L 24/03* (2013.01); *H01L 24/05* (2013.01); *H01L 24/11* (2013.01); *H01L 24/96* (2013.01); *H01L 25/0655* (2013.01); *H01L 2224/0401* (2013.01); *H01L 2224/05558* (2013.01); *H01L 2224/12105* (2013.01); *H01L 2224/16012* (2013.01); *H01L 2224/16104* (2013.01); *H01L 2224/24137* (2013.01); *H01L 2924/01013* (2013.01); *H01L 2924/01022* (2013.01); *H01L 2924/01023* (2013.01);

(Continued)

(58) Field of Classification Search
CPC ............ H01L 21/565; H01L 23/3114; H01L 23/3104; H01L 25/0655; H01L 24/16
See application file for complete search history.

(56) References Cited

U.S. PATENT DOCUMENTS

| 9,935,071 B1 | 4/2018 | Lin |
|---|---|---|
| 2005/0136641 A1 | 6/2005 | Rinne |
| 2006/0046436 A1 | 3/2006 | Ohuchi et al. |

(Continued)

FOREIGN PATENT DOCUMENTS

| CN | 102576694 A | 7/2012 |
|---|---|---|
| CN | 106206423 B | 1/2019 |

(Continued)

OTHER PUBLICATIONS

Office Action of corresponding CN Application No. 201710442644. X, dated Jun. 12, 2019, 7 pages.

(Continued)

*Primary Examiner* — Dale E Page
*Assistant Examiner* — Wilner Jean Baptiste
(74) *Attorney, Agent, or Firm* — Muncy, Geissler, Olds & Lowe, P.C.

(57) ABSTRACT

The present disclosure provides a method for preparing a semiconductor package. The method includes providing a first device having a first upper surface and a first side, wherein the first upper surface and the first side form a first corner. The method also includes forming a bump structure over the first upper surface, wherein the bump structure extends laterally across the first side of the first device.

9 Claims, 13 Drawing Sheets

(52) U.S. Cl.
CPC ............... *H01L 2924/01028* (2013.01); *H01L 2924/01029* (2013.01); *H01L 2924/18162* (2013.01)

(56) References Cited

U.S. PATENT DOCUMENTS

2006/0138675 A1    6/2006   Rinne
2012/0228750 A1    9/2012   Okumura

FOREIGN PATENT DOCUMENTS

| JP | 2008147697 A | 6/2008 |
| KR | 20070008883 A | 1/2007 |
| TW | 201115701 A | 5/2011 |

OTHER PUBLICATIONS

Search Report of corresponding CN Application No. 201710442644.X, dated Jun. 3, 2019, 5 pages.

METHOD FOR PREPARING A SEMICONDUCTOR PACKAGE

PRIORITY CLAIM AND CROSS-REFERENCE

This application is a divisional application of U.S. patent application Ser. No. 15/397,044, filed Jan. 3, 2017. The entirety of the above-mentioned patent application is hereby incorporated by reference herein and made a part of this specification.

TECHNICAL FIELD

The present disclosure relates to a semiconductor package and a method for preparing the same, and particularly relates to a semiconductor package having a bump structure implementing a lateral signal path between two laterally adjacent devices and a method for preparing the same.

DISCUSSION OF THE BACKGROUND

Semiconductor devices are essential for many modern applications. With the advancement of electronic technology, semiconductor devices are becoming smaller in size while having greater functionality and greater amounts of integrated circuitry. Due to the miniaturized scale of semiconductor devices, chip-on-chip technique is now widely used for manufacturing semiconductor devices. Numerous manufacturing steps are undertaken in the production of such semiconductor packages.

Accordingly, the manufacturing of semiconductor devices in a miniaturized scale is becoming more complicated. An increase in the complexity of manufacturing semiconductor devices may cause deficiencies such as poor electrical interconnection, development of cracks, or delamination of components. As such, there are many challenges to be overcome when modifying the structure and manufacture of semiconductor devices.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor package comprising a first device and a bump structure disposed over the first device. In some embodiments, the first device has a first upper surface and a first side, and the first upper surface and the first side form a first corner of the first device. In some embodiments, the bump structure is disposed over the first upper surface and extends laterally across the first side of the first device.

In some embodiments, the first device comprises a second upper surface and a second side, the second upper surface and the second side form a second corner of the first device, and the bump structure is disposed over the second upper surface and extends laterally across the second side of the first device.

In some embodiments, the first upper surface and the second upper surface are at different levels, and the bump structure extends vertically from the first upper surface to the second upper surface of the first device.

In some embodiments, the first device comprises a missing corner, and the bump structure fills the missing corner.

In some embodiments, the first side is substantially perpendicular to the first upper surface.

In some embodiments, the semiconductor package further comprises: a second device laterally adjacent to the first device, wherein the second device comprises a second upper surface and a second side, and the second upper surface and the second side form a second corner of the second device; wherein the bump structure extends laterally from the first upper surface of the first device to the second upper surface of the second device.

In some embodiments, the semiconductor package further comprises: a molding member surrounding the first device and the second device, wherein an intervening portion of the molding member is disposed between the first device and the second device, and the bump structure extends laterally across the intervening portion and implements a lateral signal path between the first device and the second device.

In some embodiments, the first device comprises a first missing corner, the second device comprises a second missing corner facing the first missing corner, and the bump structure fills the first missing corner and the second missing corner.

In some embodiments, the first device comprises a contact pad, the bump structure is disposed over the contact pad, and the contact pad comprises a step pad profile.

In some embodiments, the bump structure comprises a step bump profile facing the step pad profile of the contact pad.

Another aspect of the present disclosure provides a method for preparing a semiconductor package, comprising: providing a first device having a first upper surface and a first side, wherein the first upper surface and the first side form a first corner; and forming a bump structure over the first upper surface, wherein the bump structure extends laterally across the first side of the first device.

In some embodiments, the method comprises: forming a second upper surface and a second side in the first device, wherein the second upper surface and the second side form a second corner of the first device; and forming the bump structure over the second upper surface and extending laterally across the second side of the first device.

In some embodiments, the first upper surface and the second upper surface are formed at different levels, and the bump structure extends vertically from the first upper surface to the second upper surface of the first device.

In some embodiments, the method comprises: forming a missing corner in the first device; and forming the bump structure over the first upper surface and filling the missing corner.

In some embodiments, the method further comprises: providing a second device laterally adjacent to the first device, wherein the second device comprises a second upper surface and a second side, and the second upper surface and the second side form a second corner of the second device; and wherein the bump structure extends laterally from the first device across the second side to the second upper surface of the second device.

In some embodiments, the method further comprises: forming a molding member surrounding the first device and the second device, wherein the molding member includes an intervening portion between the first device and the second device, and the bump structure extends laterally across the intervening portion, and the bump structure implements a lateral signal path between the first device and the second device.

In some embodiments, the method comprises: forming a first missing corner in the first device and a second missing corner in the second device; wherein the first missing corner faces the second missing corner, and the bump structure fills the first missing corner and the second missing corner.

In some embodiments, the method comprises: forming a missing corner in the first device; forming a conductive contact pad over the missing corner; and forming the bump structure over the conductive contact pad and filling the missing corner.

In some embodiments, the method comprises: forming a conductive contact pad in the first device, wherein the conductive contact pad comprises a first conductive layer at a first level, a second conductive layer at a second level, and a conductive via electrically connecting the first conductive layer and the second conductive layer; forming a missing corner exposing the conductive contact pad; and forming the bump structure over the conductive contact pad and filling the missing corner.

In some embodiments, the method comprises: forming a conductive contact pad having a step pad profile in the first device; and forming the bump structure having a step bump profile facing the step pad profile of the first device.

The embodiments of the present disclosure provide a semiconductor package with a bump structure implementing the lateral signal path between two laterally adjacent devices in the absence of a redistribution structure. Consequently, the height of the semiconductor package of the present disclosure is less than the height of a semiconductor package with a redistribution structure. In other words, the semiconductor package of the present disclosure can meet the miniaturized scale demand (small form factor) of the semiconductor packages. In addition, the absence of the redistribution structure is a key factor in the reduction of the fabrication cost of the semiconductor package.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

The following description of the disclosure accompanies drawings, which are incorporated in and constitute a part of this specification, and which illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to a semiconductor package having a bump structure implementing a lateral signal path between two laterally adjacent devices and a method for preparing the same. In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure will be described below in detail. However, in addition to the detailed description, the present disclosure may also be widely implemented in other embodiments. The scope of the present disclosure is not limited to the detailed description, and is defined by the claims.

Figure 1:
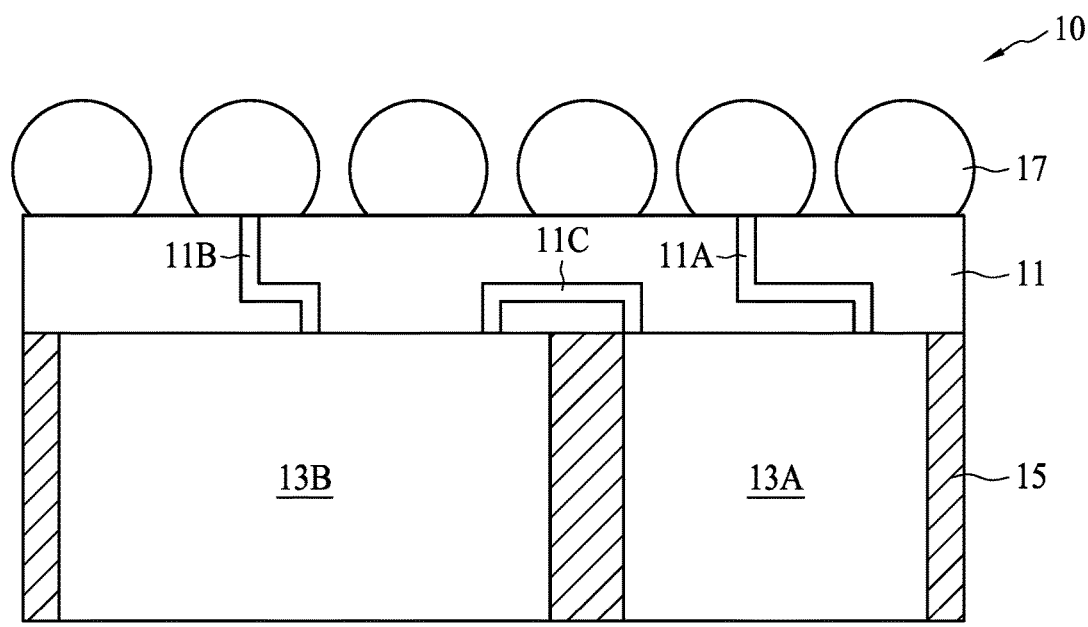
FIG. 1 is a cross-sectional view of a semiconductor package in accordance with a comparative embodiment of the present disclosure.

FIG. 1 is a cross-sectional view of a semiconductor package 10 in accordance with a comparative embodiment of the present disclosure. The semiconductor package 10 includes a redistribution layer 11, a semiconductor chip 13A and a semiconductor chip 13B disposed on the redistribution layer 11, a molding member 15 encapsulating the semiconductor chip 13A and the semiconductor chip 13B on the redistribution layer 11, and a plurality of conductive bumps 17 disposed on the redistribution layer 11. In some embodiments, the conductive bumps 17 are disposed on the upper side of the redistribution layer 11, while the semiconductor chip 13A and the semiconductor chip 13B are disposed on the bottom side of the redistribution layer 11.

In some embodiments, a vertical signal path of the semiconductor chip 13A is implemented by a conductive line 11A in the redistribution layer 11 and one of the conductive bumps 17, a vertical signal path of the semiconductor chip 13B is implemented by a conductive line 11B in the redistribution layer 11 and one of the conductive bumps 17, and a lateral signal path between the semiconductor chip 13A and the semiconductor chip 13B is implemented by a conductive line 11C in the redistribution layer 11 in the absence of the conductive bumps 17.

Figure 2:
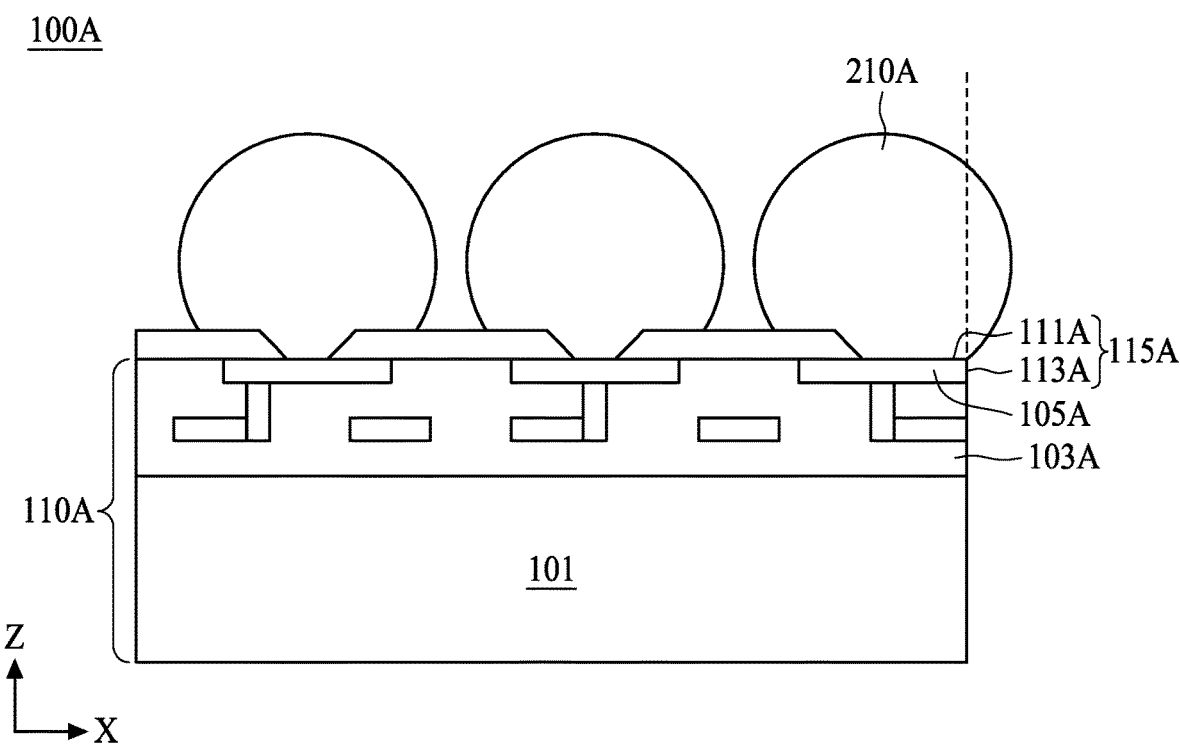
FIG. 2 is a cross-sectional view of a semiconductor package in accordance with some embodiments of the present disclosure.

FIG. 2 is a cross-sectional view of a semiconductor package 100A in accordance with some embodiments of the present disclosure. In some embodiments, the semiconductor package 100A comprises a semiconductor device 110A and a plurality of bump structures 210A disposed over the semiconductor device 110A. In some embodiments, the semiconductor device 110A includes a first upper surface 111A and a first side 113A, and the first upper surface 111A and the first side 113A form a first corner 115A of the semiconductor device 110A. In some embodiments, one of the bump structures 210A at the upper right edge of the semiconductor device 110A extends laterally along the lateral direction (X-direction in the drawing) across the first side 113A of the semiconductor device 110A. In some embodiments, the first side 113A is substantially perpendicular to the first upper surface 111A.

In some embodiments, the semiconductor package 100A comprises a semiconductor substrate 101 and an electrical interconnect 103A; the semiconductor substrate 101 can be a silicon substrate, a semiconductor-on-insulator (SOI) substrate, or any construction comprising semiconductor materials; and the electrical interconnect 103A comprises dielectric material and conductive elements made of, for example, Ti, Al, Ni, nickel vanadium (NiV), Cu, or a Cu alloy. In some embodiments, the semiconductor package 100A includes integrated circuits (IC) or semiconductor components such as transistors, capacitors, resistors, diodes, photo-diodes, fuses, and the like configured to perform one or more functions, wherein the IC and semiconductor components are not shown for clarity in this illustration.

In some embodiments, the electrical interconnect 103A of the semiconductor package 100A comprises a conductive contact pad 105A, and the bump structure 210A is disposed over the conductive contact pad 105A. In some embodiments, the conductive contact pad 105A is made of aluminum (Al), copper (Cu), tin (Sn), nickel (Ni), gold (Au), silver (Ag), or other electrically conductive materials.

In some embodiments, the lateral extension of the bump structure 210A at the upper right edge across the first side 113A of the semiconductor device 110A can contact a corresponding conductor of a laterally adjacent device to implement a lateral signal path between the semiconductor device 110A and the laterally adjacent device in the absence of a redistribution structure corresponding to the redistribution layer 11 shown in FIG. 1.

Figure 3:
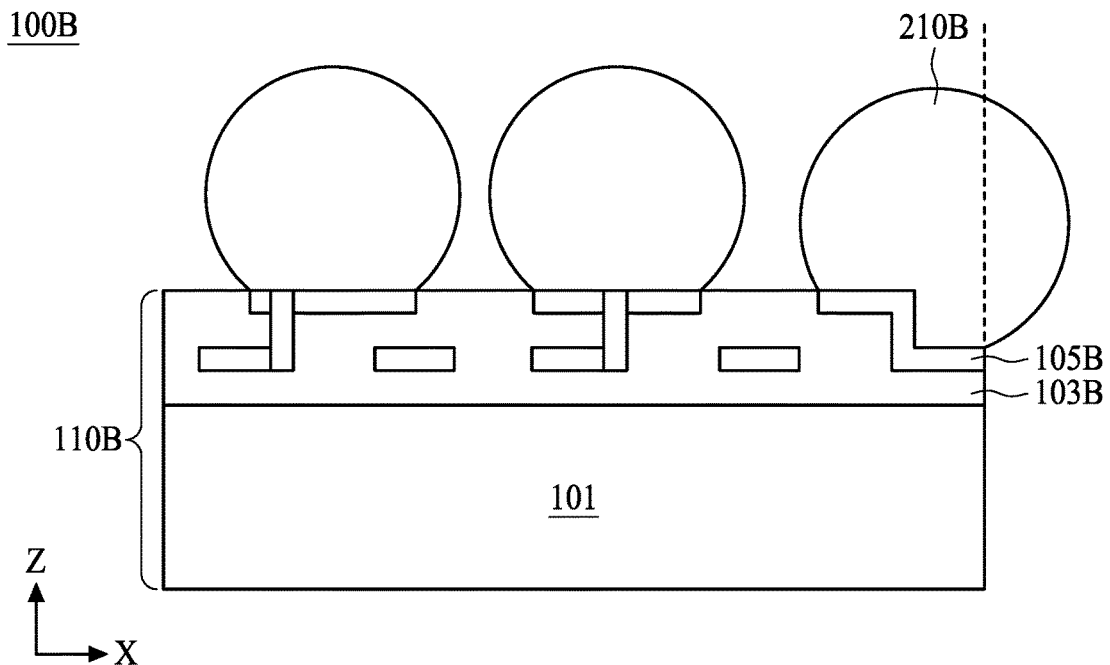
FIG. 3 is a cross-sectional view of a semiconductor package in accordance with some embodiments of the present disclosure.
Figure 4:
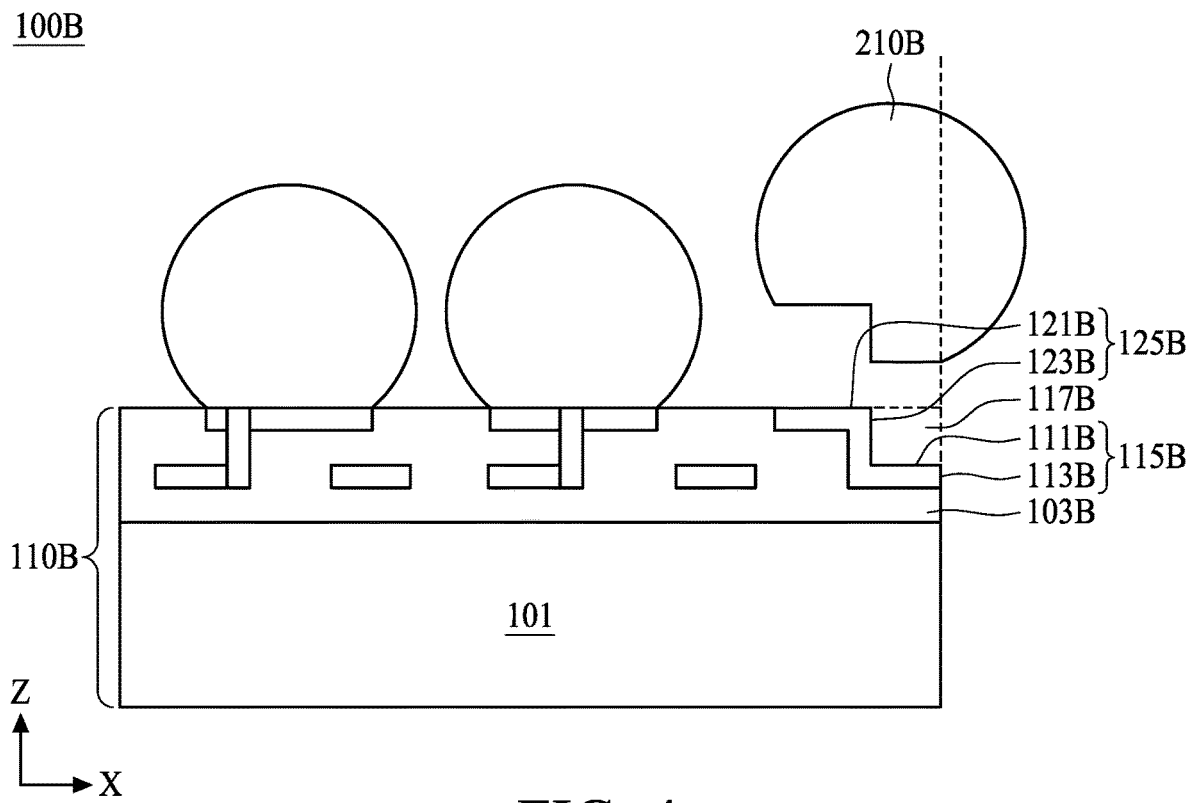
FIG. 4 is a disassembled cross-sectional view of the semiconductor package in FIG. 3.

FIG. 3 is a cross-sectional view of a semiconductor package 100B in accordance with some embodiments of the present disclosure, and FIG. 4 is a disassembled cross-sectional view of the semiconductor package 100B in FIG. 3. The semiconductor package 100B shown in FIG. 3 is substantially the same as the semiconductor package 100A shown in FIG. 2, except for the conductive contact pad 105B of the semiconductor device 110B and the bump structure 210B over the conductive contact pad 105B, wherein in FIG. 4, the bump structure 210B is disassembled from the conductive contact pad 105B for clarity in the illustration.

In FIG. 2, the conductive contact pad 105A at the upper right edge has a substantially planar profile, whereas in FIG. 3, the conductive contact pad 105B at the upper right edge serves as an edge-bumping pad having a step pad profile, and the bottom of the bump structure 210B at the upper right has a step bump profile facing the step pad profile of the conductive contact pad 105B serving as the edge-bumping pad. In some embodiments, the semiconductor device 100B comprises a missing corner 117B exposing the edge-bumping pad, and the bump structure 210B fills the missing corner 117B.

Referring to FIG. 4, in some embodiments, the semiconductor device 100B comprises a first upper surface 111B and a first side 113B, and the first upper surface 111B and the first side 113B form a first corner 115B of the semiconductor device 110B; furthermore, the semiconductor device 100B comprises a second upper surface 121B and a second side 123B, and the second upper surface 121B and the second side 123B form a second corner 125B of the semiconductor device 110B. In some embodiments, the first side 113B is substantially perpendicular to the first upper surface 111B, and the second side 123B is substantially perpendicular to the second upper surface 121B.

In some embodiments, the first upper surface 111B and the second upper surface 121B are at different levels along the vertical direction (Z-direction in the drawing), and the bump structure 210B extends vertically from the first upper surface 111B to the second upper surface 121B of the semiconductor device 100B. In some embodiments, the bump structure 210B is disposed over the second upper surface 121B and the first upper surface 111B; in addition, the bump structure 210B extends laterally along the lateral direction (X-direction in the drawing) across the second side 123B and the first side 113B of the semiconductor device 100B.

In some embodiments, the lateral extension of the bump structure 210B at the upper right edge across the first side 113B of the semiconductor device 110B can contact a corresponding conductor of a laterally adjacent device to implement a lateral signal path between the semiconductor device 110B and the laterally adjacent device in the absence of a redistribution structure corresponding to the redistribution layer 11 shown in FIG. 1.

Figure 5:
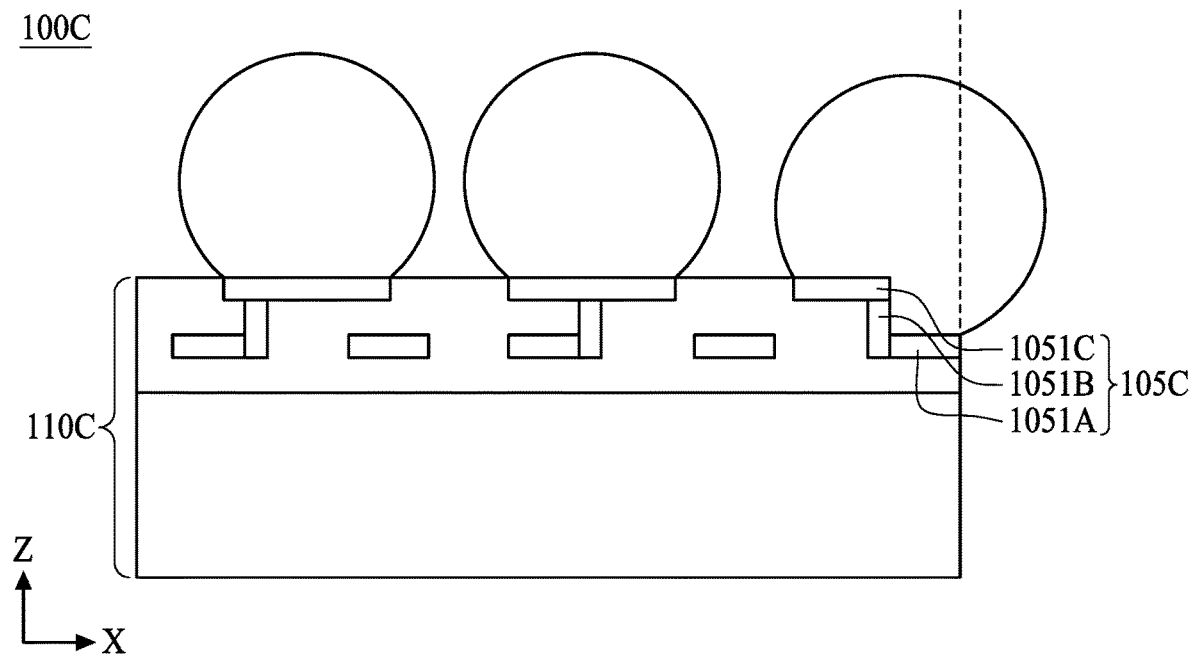
FIG. 5 is a cross-sectional view of a semiconductor package in accordance with some embodiments of the present disclosure.

FIG. 5 is a cross-sectional view of a semiconductor package 100C in accordance with some embodiments of the present disclosure. The semiconductor package 100C shown in FIG. 5 is substantially the same as the semiconductor package 100B shown in FIG. 3, except for differences in the conductive contact pad 105C of the semiconductor device 110C. In FIG. 3, the conductive contact pad 105B serving as the edge-bumping pad at the upper right edge is an integrally formed member, whereas in FIG. 5, the conductive contact pad 105C serving as the edge-bumping pad at the upper right edge is formed of several parts 1051A, 1051B, and 1051C. In some embodiments, the parts 1051A, 1051B, and 1051C may be made of different conductors.

Figure 6:
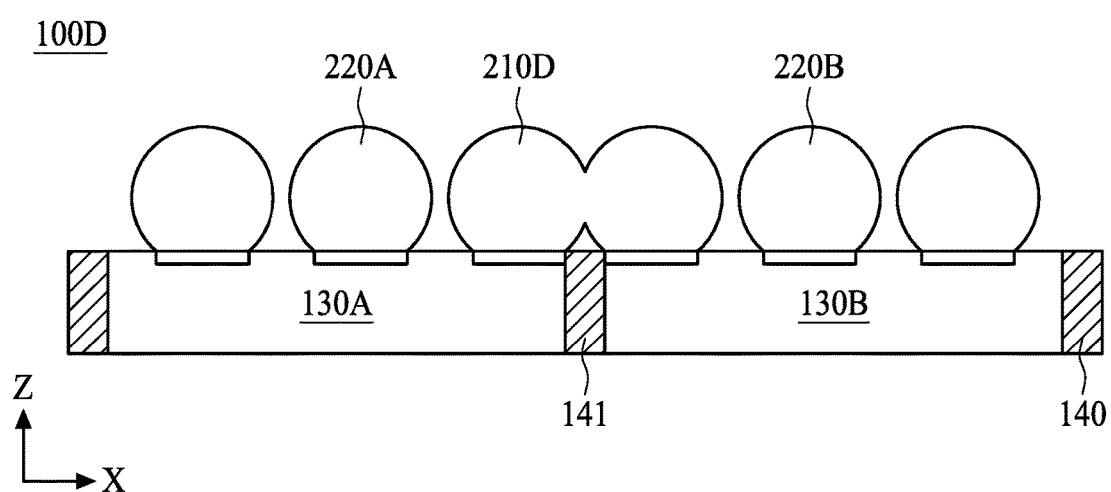
FIG. 6 is a cross-sectional view of a semiconductor package in accordance with some embodiments of the present disclosure.

FIG. 6 is a cross-sectional view of a semiconductor package 100D in accordance with some embodiments of the present disclosure. In some embodiments, the semiconductor package 100D comprises: a first semiconductor device 130A; a second semiconductor device 130B laterally adjacent to the first semiconductor device 130A; a molding member 140 encapsulating the first semiconductor device 130A and the second semiconductor device 130B; and a bump structure 210D implementing a lateral signal path between the first semiconductor device 130A and the second semiconductor device 130B. In some embodiments, the first semiconductor device 130A and the second semiconductor device 130B may be the semiconductor device 110A shown in FIG. 2.

In some embodiments, the bump structure 210D extends laterally from the upper surface of the first semiconductor device 130A to the upper surface of the second semiconductor device 130B. In some embodiments, an intervening portion 141 of the molding member 140 is disposed between the first semiconductor device 130A and the second semiconductor device 130B, and the bump structure 210D extends laterally across the intervening portion 141 of the molding member 140.

In some embodiments, the first semiconductor device 130A and the second semiconductor device 130B are two adjacent chips of a single wafer. In some embodiments, the first semiconductor device 130A and the second semiconductor device 130B are two chips from different wafers. In some embodiments, the semiconductor package 100A further comprises a vertical bump structure 220A implementing a vertical signal path of the first semiconductor device 130A and a vertical bump structure 220B implementing a vertical signal path of the second semiconductor device 130B.

In some embodiments, the bump structure 210D implements the lateral signal path between the first semiconductor device 130A and the second semiconductor device 130B in the absence of a redistribution structure corresponding to the redistribution layer 11 shown in FIG. 1. Consequently, the height of the semiconductor package 100D in FIG. 6 is less than the height of the semiconductor package 10 in FIG. 1. In other words, the semiconductor package 100D in FIG. 6 can meet the miniaturized scale demand (small form factor) of the semiconductor packages. In addition, the absence of a redistribution structure corresponding to the redistribution layer 11 shown in FIG. 1 is a key factor in the reduction of the fabrication cost of the semiconductor package 100D in FIG. 6.

Figure 7:
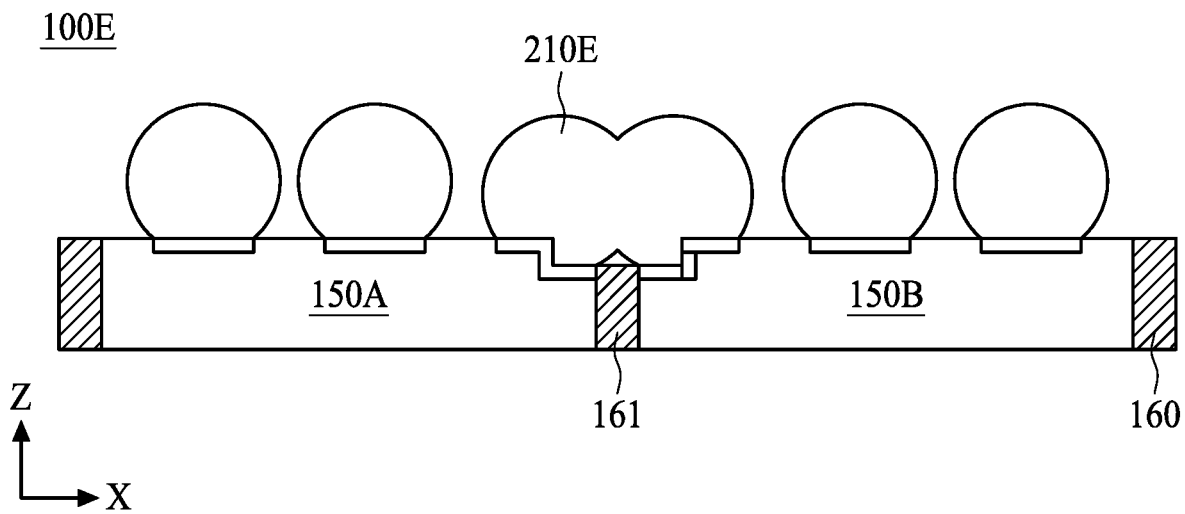
FIG. 7 is a cross-sectional view of a semiconductor package in accordance with some embodiments of the present disclosure.

FIG. 7 is a cross-sectional view of a semiconductor package 100E in accordance with some embodiments of the present disclosure. In some embodiments, the semiconductor package 100E comprises: a first semiconductor device 150A; a second semiconductor device 150B laterally adjacent to the first semiconductor device 150A; a molding member 160 encapsulating the first semiconductor device 150A and the second semiconductor device 150B; and a bump structure 210E implementing a lateral signal path between the first semiconductor device 150A and the second semiconductor device 150B. In some embodiments, the first semiconductor device 150A may be the semiconductor device 110B shown in FIG. 3, and the second semiconductor device 150B may be the semiconductor device 110C shown in FIG. 5.

In some embodiments, the bump structure 210E extends laterally from the upper surface of the first semiconductor device 150A to the upper surface of the second semiconductor device 150B. In some embodiments, an intervening portion 161 of the molding member 160 is disposed between the first semiconductor device 150A and the second semiconductor device 150B, and the bump structure 210E extends laterally across the intervening portion 161 of the molding member 160.

In some embodiments, the bump structure 210E implements the lateral signal path between the first semiconductor device 150A and the second semiconductor device 150B in the absence of a redistribution structure corresponding to the redistribution layer 11 shown in FIG. 1. Consequently, the height of the semiconductor package 100E in FIG. 7 is less than the height of the semiconductor package 10 in FIG. 1. In other words, the semiconductor package 100E in FIG. 7 can meet the miniaturized scale demand (small form factor) of the semiconductor packages. In addition, the absence of a redistribution structure corresponding to the redistribution layer 11 shown in FIG. 1 is a key factor in the reduction of the fabrication cost of the semiconductor package 100E in FIG. 7.

Figure 8:
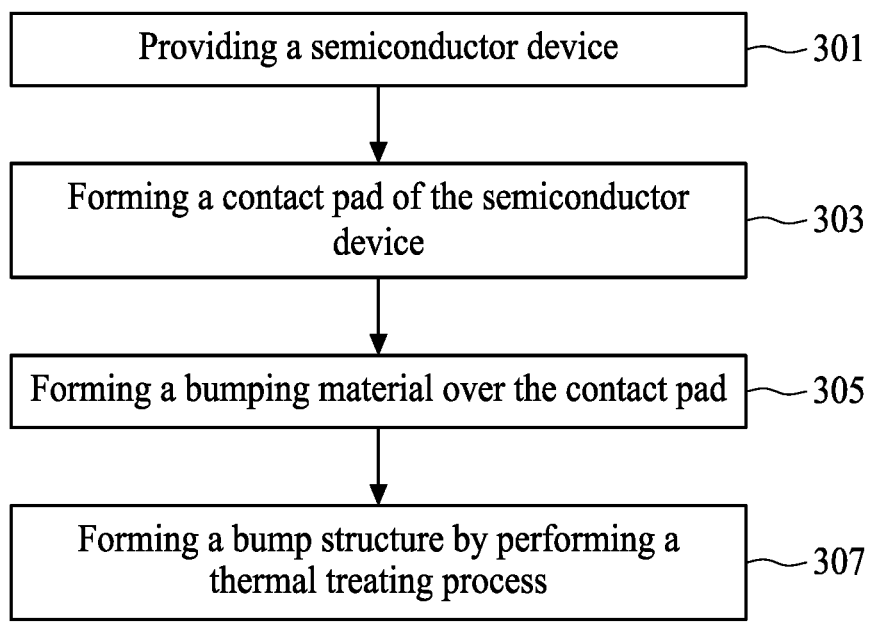
FIG. 8 is a flow chart of a method for preparing a semiconductor package in accordance with some embodiments of the present disclosure.

FIG. 8 is a flow chart of a method for preparing a semiconductor package in accordance with some embodiments of the present disclosure. In some embodiments, the semiconductor package can be formed by a method 300 of FIG. 8. The method 300 includes a number of operations and the description and illustration are not deemed as a limitation as the sequence of the operations. The method 300 includes a number of steps (301, 303, 305, and 307).

Figure 9:
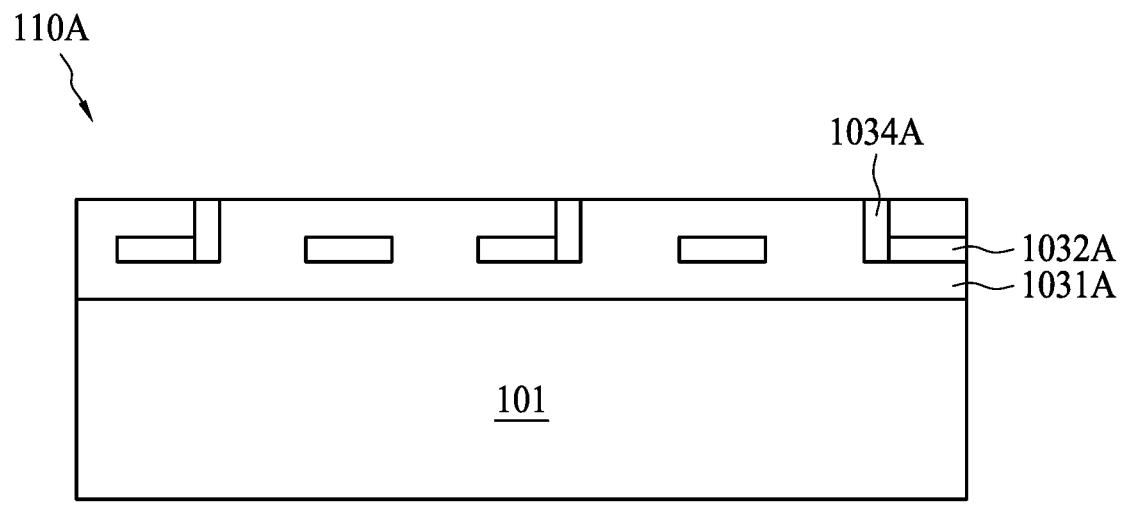
FIGS. 9 to 13 are schematic views of a process for preparing the semiconductor package by the method of FIG. 8 in accordance with some embodiments of the present disclosure.

In step 301, a semiconductor device 110A is provided as shown in FIG. 9. In some embodiments, the semiconductor device 110A comprises a semiconductor substrate 101, a passivation layer 1031A with several conductors 1032A and a plurality of conductive vias 1034A electrically connected to the conductors 1032A.

Figure 10:
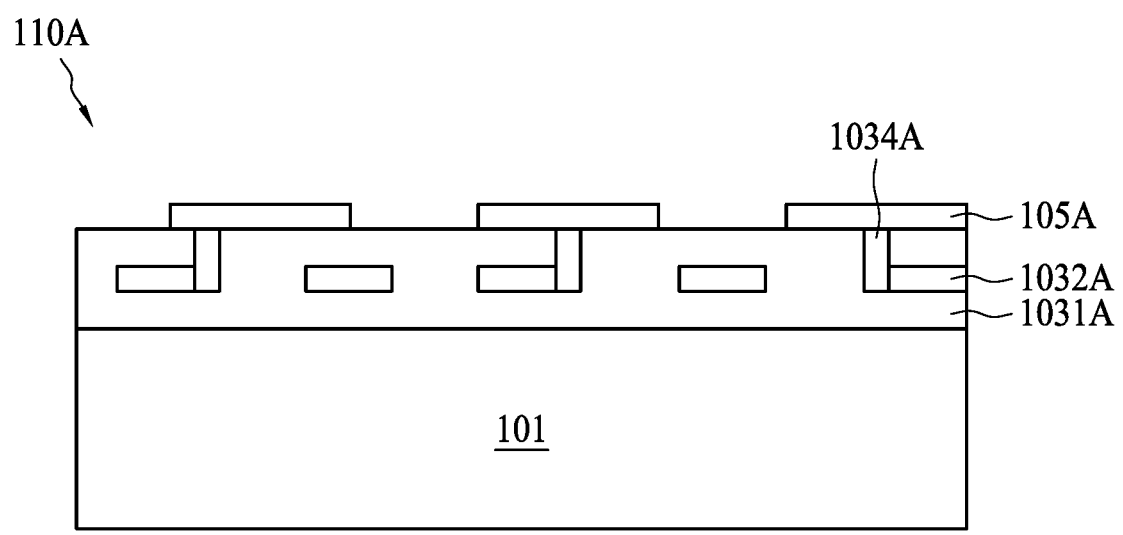

In step 303, a plurality of conductive contact pads 105A are formed on the passivation layer 1031A as shown in FIG. 10. In some embodiments, one of the conductive contact pads 105A at the upper right edge serves as an edge-bumping pad, which has a substantially planar profile. In some embodiments, the conductive contact pads 105A are formed by deposition and etching processes or any other suitable process.

Figure 11:
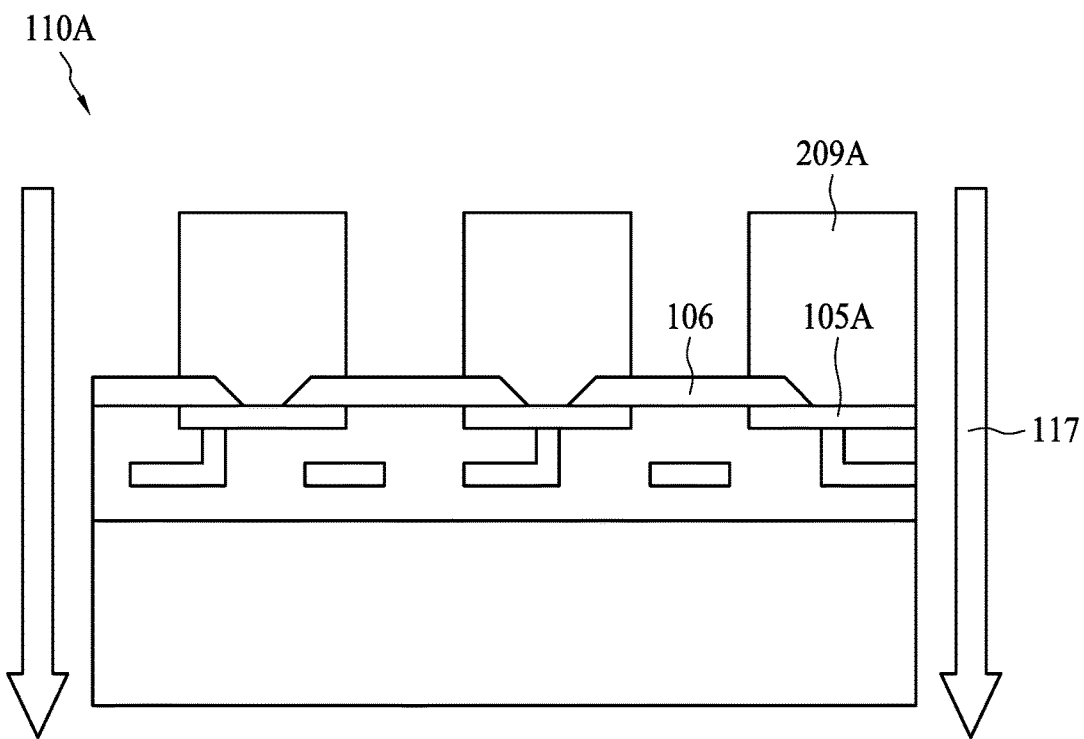

In step 305, a plurality of bumping materials 209A are formed on the conductive contact pads 105A, with a patterned post-passivation layer 106, as shown in FIG. 11. In some embodiments, the bumping material 209A includes lead-free solders, including tin, copper, and silver, or "SAC" compositions, and other eutectics that have a common melting point and form conductive solder connections in electrical applications.

In some embodiments, the semiconductor device 110A is a wafer, and the wafer is cut into separated semiconductor dies. In some embodiments, the wafer is separated through a die cutting or singulation process in which, typically, a singulation tool 117 such as a mechanical or laser saw is used to cut through the substrate between individual chips or dies. In some embodiments, the laser sawing uses an Argon (Ar) based ion laser beam tool.

Figure 12:
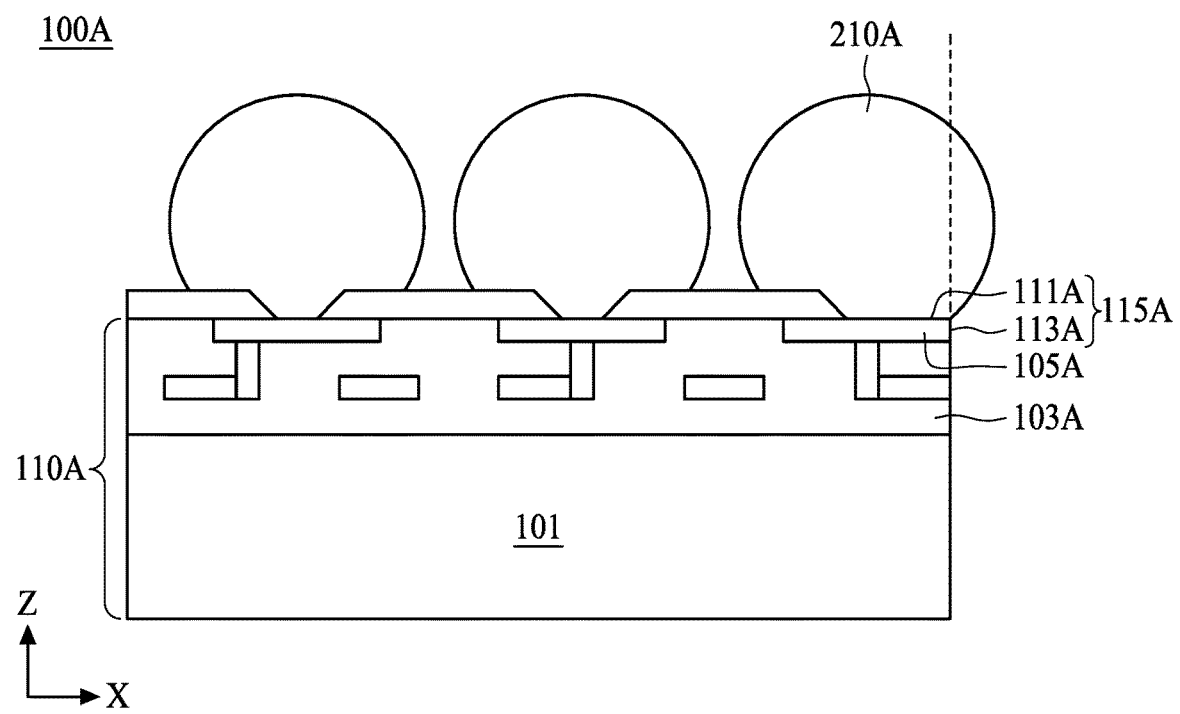

In step 307, a plurality of bump structures 210A are formed over the conductive contact pads 105A as shown in FIG. 12. In some embodiments, the bump structure 210A is formed by performing a thermal treating process such as an infrared (IR) reflow process to the bumping materials 209A. In some embodiments, the bump structure 210A over the edge-bumping pad extends laterally along the lateral direction (X-direction in the drawing) across the first side 113A of the semiconductor device 110A.

Figure 13:
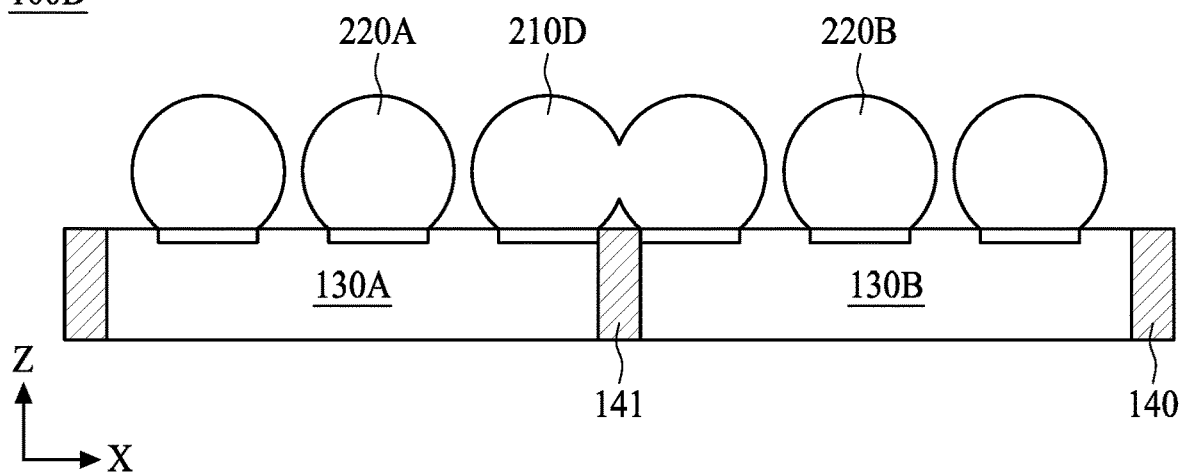

Referring to FIG. 13, in alternative embodiments, after finishing the process shown in FIG. 11, two semiconductor devices are laterally disposed and adjacent to one another, and a molding member 140 is then formed to encapsulate the two semiconductor devices. Subsequently, a thermal treating process such as an infrared (IR) reflow process is performed to form a bump structure 210D implementing a lateral signal path between the two semiconductor devices. In some embodiments, the bump structure 210D extends laterally across the intervening portion 141 of the molding member 140.

Figure 14:
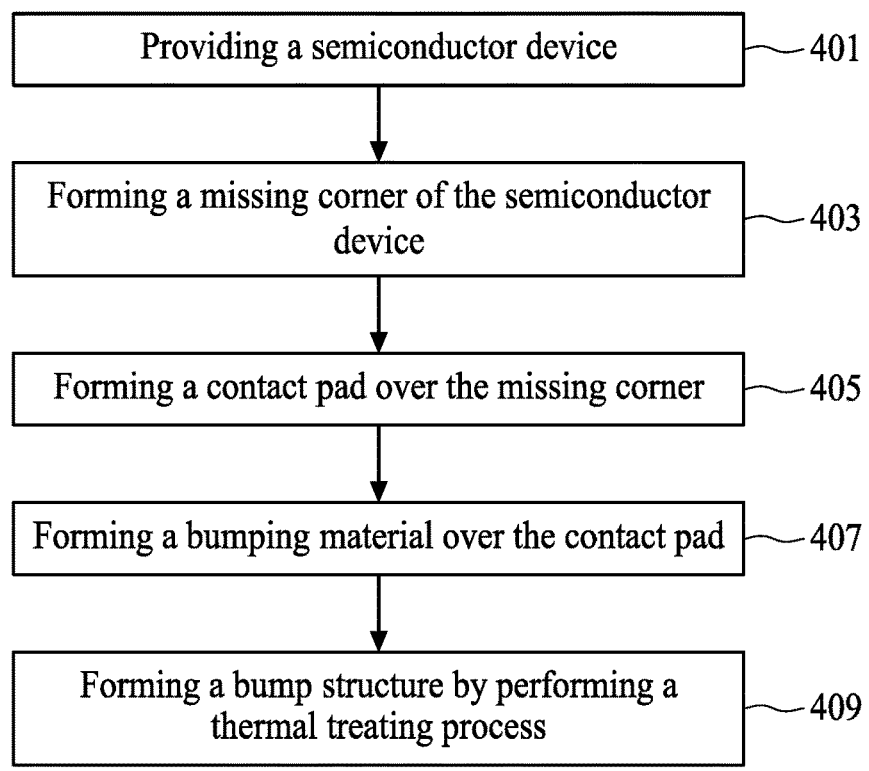
FIG. 14 is a flow chart of a method for preparing a semiconductor package in accordance with some embodiments of the present disclosure.

FIG. 14 is a flow chart of a method for preparing a semiconductor package in accordance with some embodiments of the present disclosure. In some embodiments, the semiconductor package can be formed by a method 400 of FIG. 14. The method 400 includes a number of operations and the description and illustration are not deemed as a limitation as the sequence of the operations. The method 400 includes a number of steps (401, 403, 405, 407, and 409).

Figure 15:
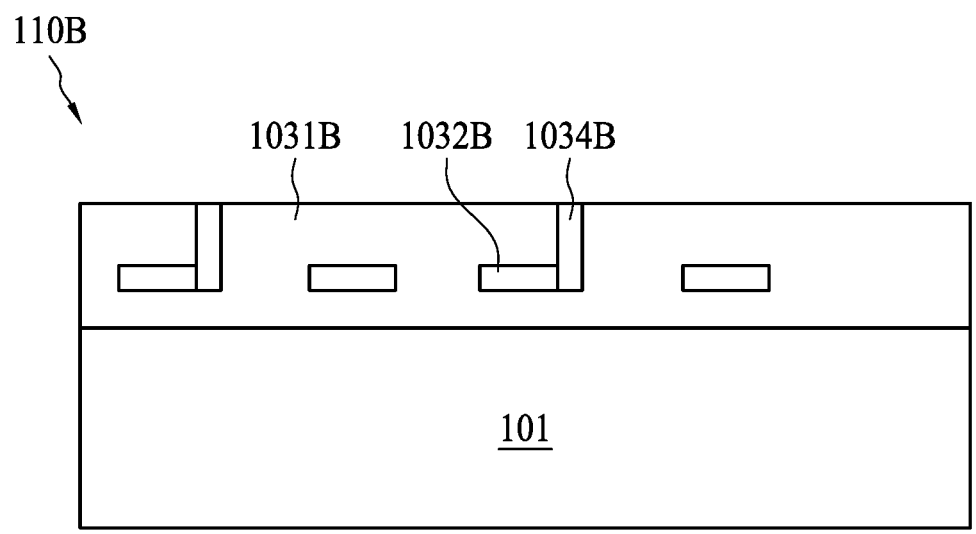
FIGS. 15 to 19 are schematic views of a process for preparing the semiconductor package by the method of FIG. 14 in accordance with some embodiments of the present disclosure.

In step 401, a semiconductor device 110B is provided as shown in FIG. 15. In some embodiments, the semiconductor device 110B comprises a semiconductor substrate 101, a passivation layer 1031B with several conductors 1032B and a plurality of conductive vias 1034B electrically connected to the conductors 1032B.

Figure 16:
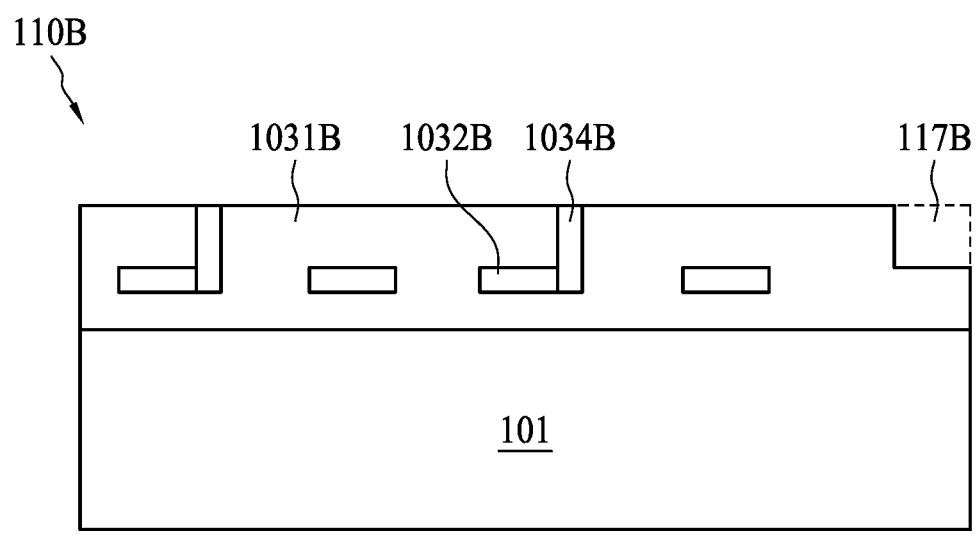

In step 403, a missing corner 117B is formed in the semiconductor device 110B, as shown in FIG. 16. In some embodiments, the missing corner 117B is formed by lithographic and etching processes to the passivation layer 1031B.

Figure 17:
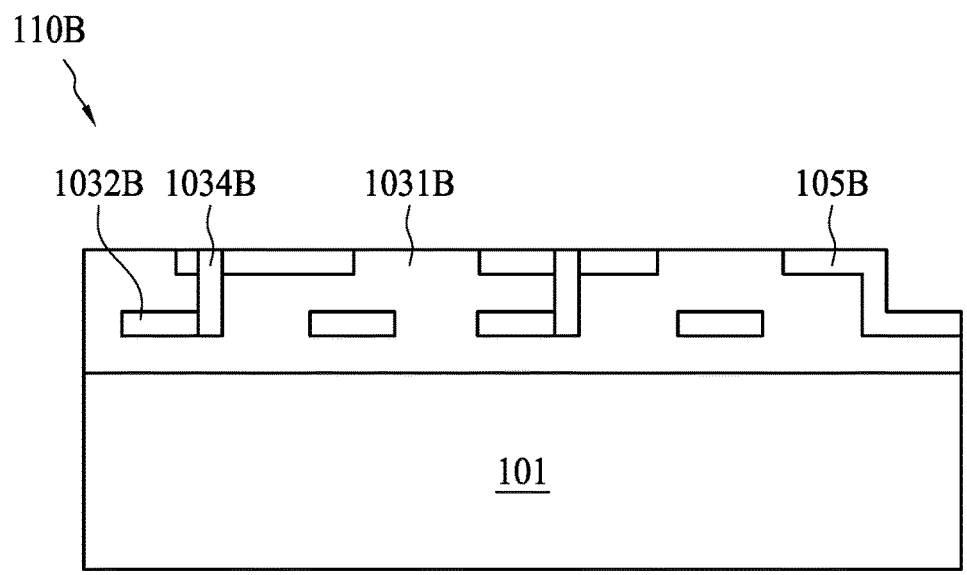

In step 405, a plurality of conductive contact pads 105B are formed on the passivation layer 1031B as shown in FIG. 17. In some embodiments, one of the conductive contact pads 105B at the upper right edge serves as an edge-bumping pad, which is close to the edge of the semiconductor device 110B and has a step pad profile. In some embodiments, the conductive contact pads 105A are formed by deposition and etching processes or any other suitable process.

Figure 18:
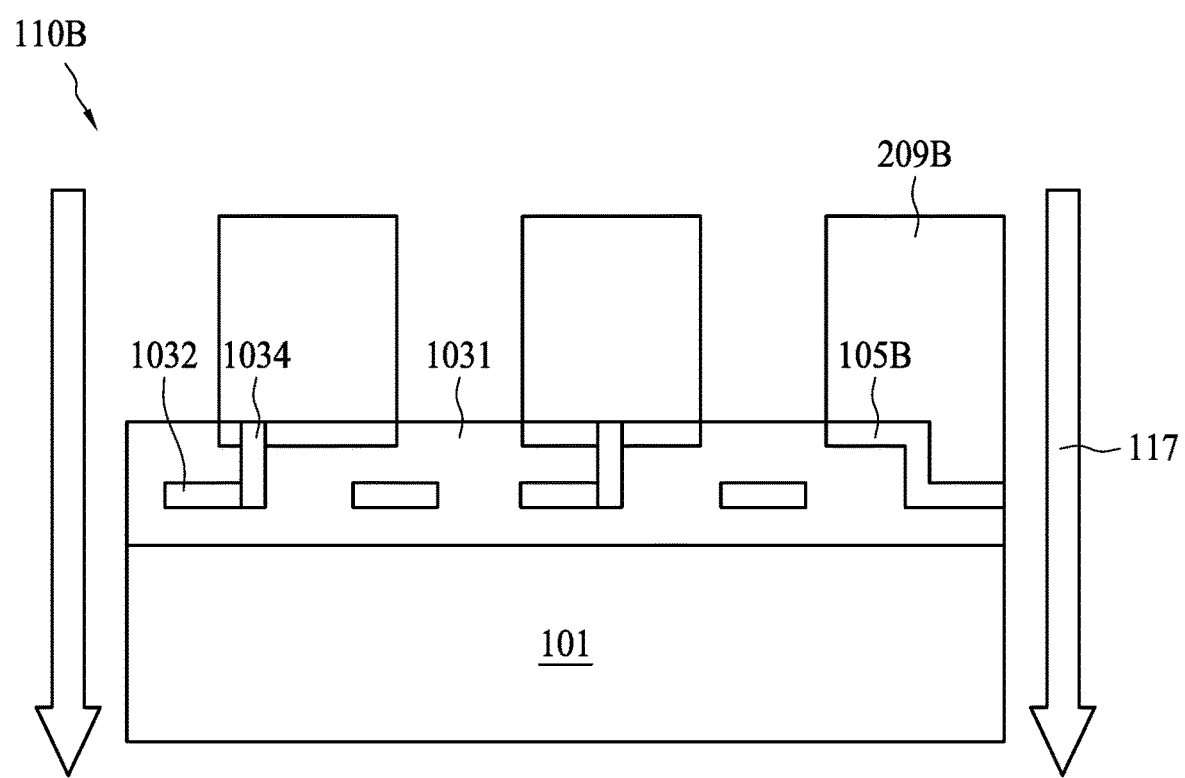

In step 407, a plurality of bumping materials 209B are formed on the conductive contact pads 105B, as shown in FIG. 18. In some embodiments, the bottom of the bump structure 210B over the edge-bumping pad has a step bump profile facing the step pad profile of the edge-bumping pad. In some embodiments, the bumping material 209B includes lead-free solders, including tin, copper, and silver, or "SAC" compositions, and other eutectics that have a common melting point and form conductive solder connections in electrical applications.

Figure 19:
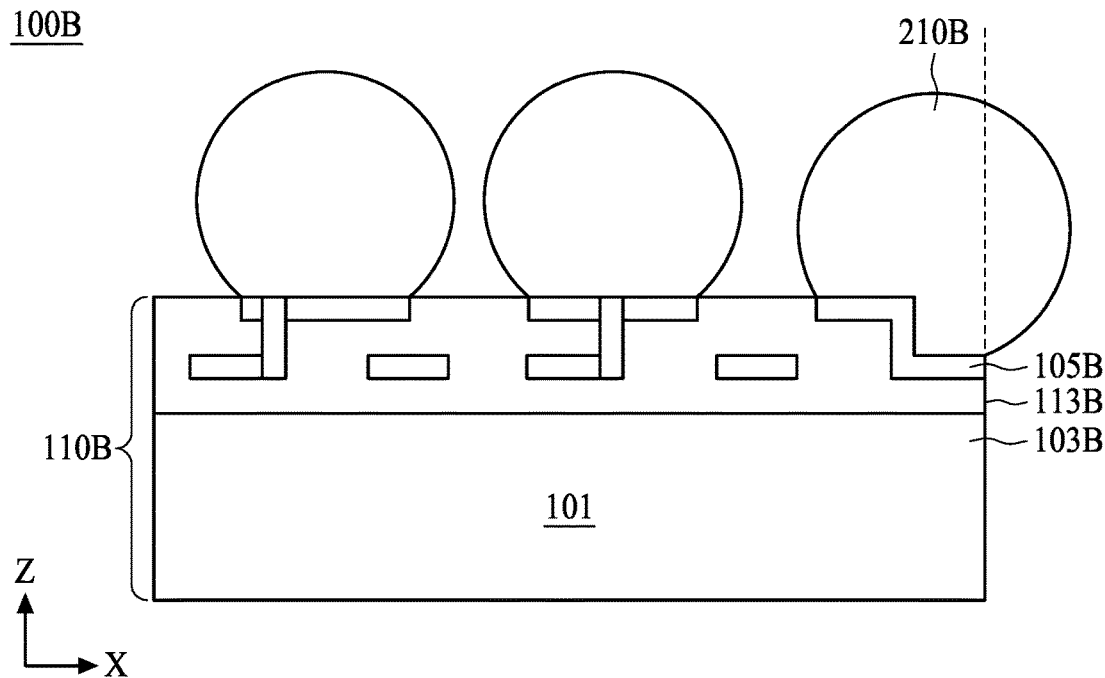

In step 409, a plurality of bump structures 210B are formed over the conductive contact pads 105B as shown in FIG. 19. In some embodiments, the bump structure 210B is formed by performing a thermal treating process such as an infrared (IR) reflow process to the bumping material 209B. In some embodiments, the bump structure 210B over the edge-bumping pad extends laterally along the lateral direction (X-direction in the drawing) across the first side 113B of the semiconductor device 110B.

Figure 20:
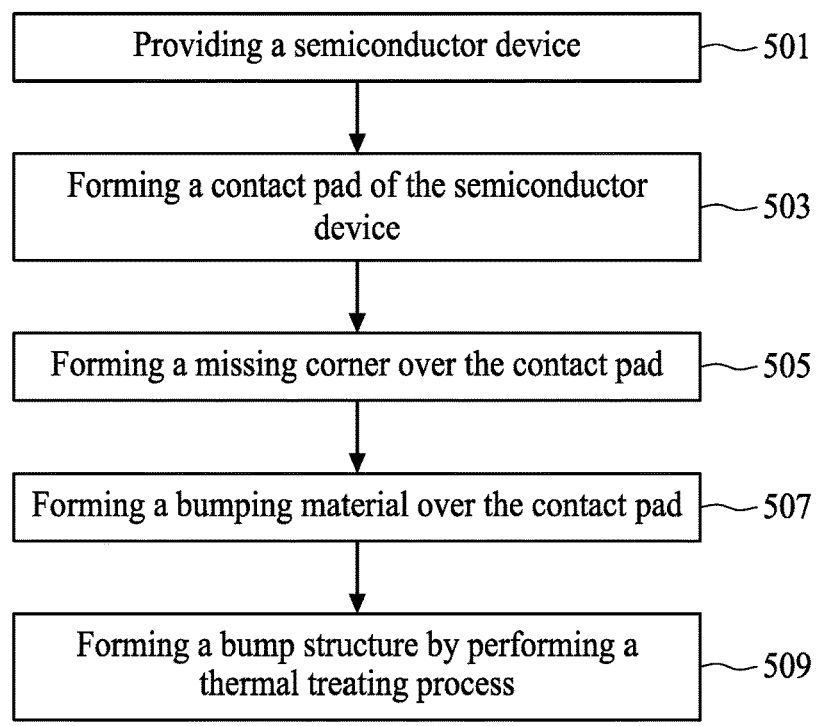
FIG. 20 is a flow chart of a method for preparing a semiconductor package in accordance with some embodiments of the present disclosure.

FIG. 20 is a flow chart of a method for preparing a semiconductor package in accordance with some embodiments of the present disclosure. In some embodiments, the semiconductor package can be formed by a method 500 of FIG. 20. The method 500 includes a number of operations and the description and illustration are not deemed as a limitation as the sequence of the operations. The method 500 includes a number of steps (501, 503, 505, 507, and 509).

Figure 21:
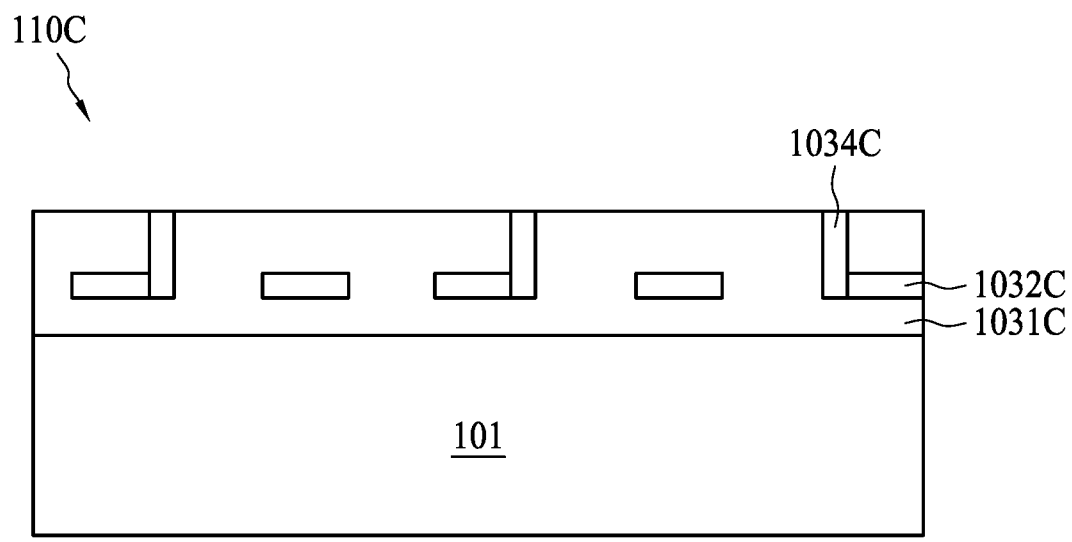
FIGS. 21 to 26 are schematic views of a process for preparing the semiconductor package by the method of FIG. 20 in accordance with some embodiments of the present disclosure.

In step 501, a semiconductor device 110C is provided as shown in FIG. 21. In some embodiments, the semiconductor device 110C comprises a semiconductor substrate 101, a passivation layer 1031C with several conductors 1032C, and a plurality of conductive vias 1034C electrically connected to the conductors 1032C.

Figure 22:
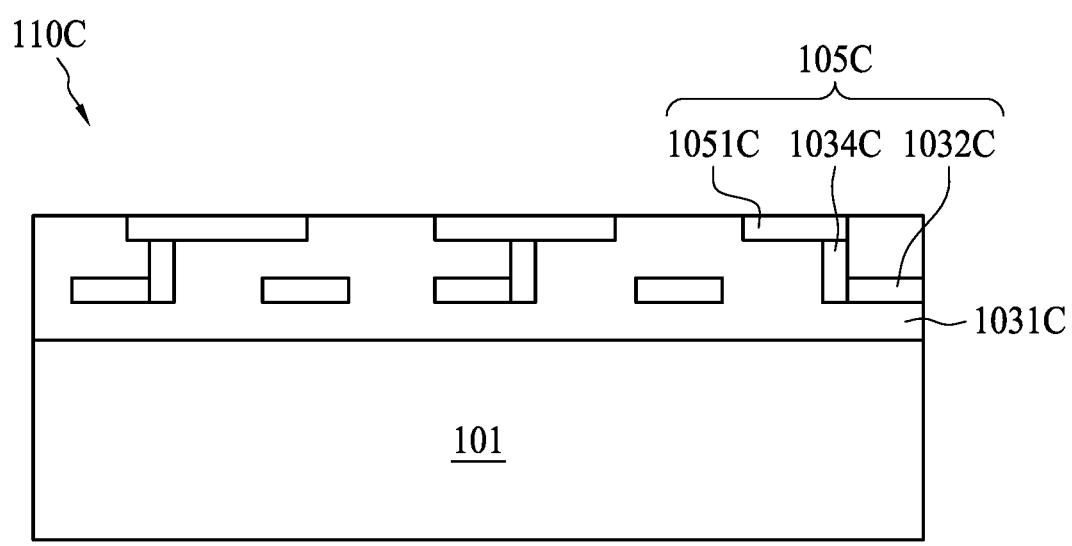

In step 503, a plurality of conductive contact pads 1051C are formed on the passivation layer 1031C as shown in FIG. 22. In some embodiments, one of the conductive contact pads 1051C is close to the edge of the semiconductor device 110C, and an edge-bumping pad 105C having a step pad profile is formed of one conductive contact pad 1051C, one internal conductor 1032C and one conductive via 1034C at the upper right portion of the semiconductor device 110C. In some embodiments, the conductive contact pads 1051C are formed by deposition and etching processes or any other suitable process.

Figure 23:
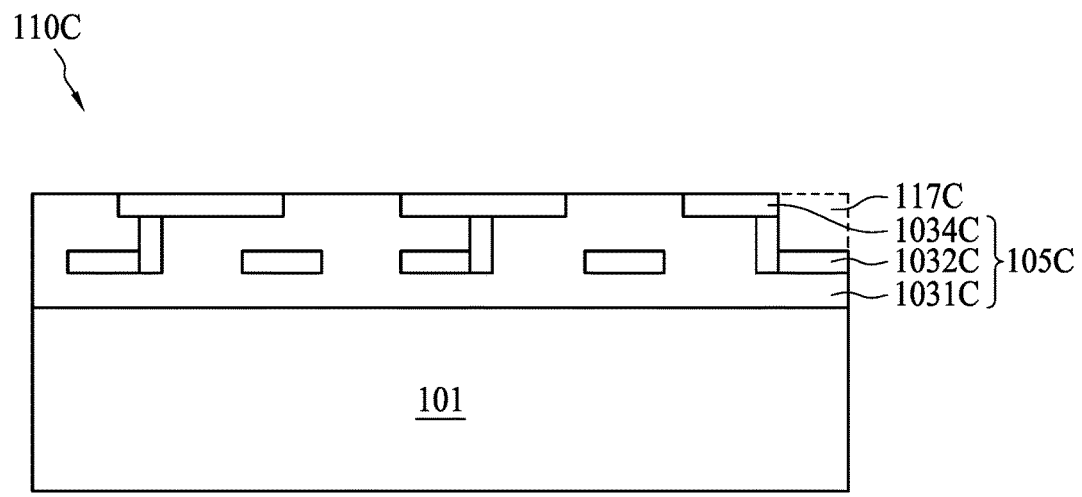

In step 505, a missing corner 117C is formed in the semiconductor device 110C, as shown in FIG. 23. In some embodiments, the missing corner 117C is formed by lithographic and etching processes to the passivation layer 1031 to expose the edge-bumping pad 105C at the upper right portion of the semiconductor device 110C.

Figure 24:
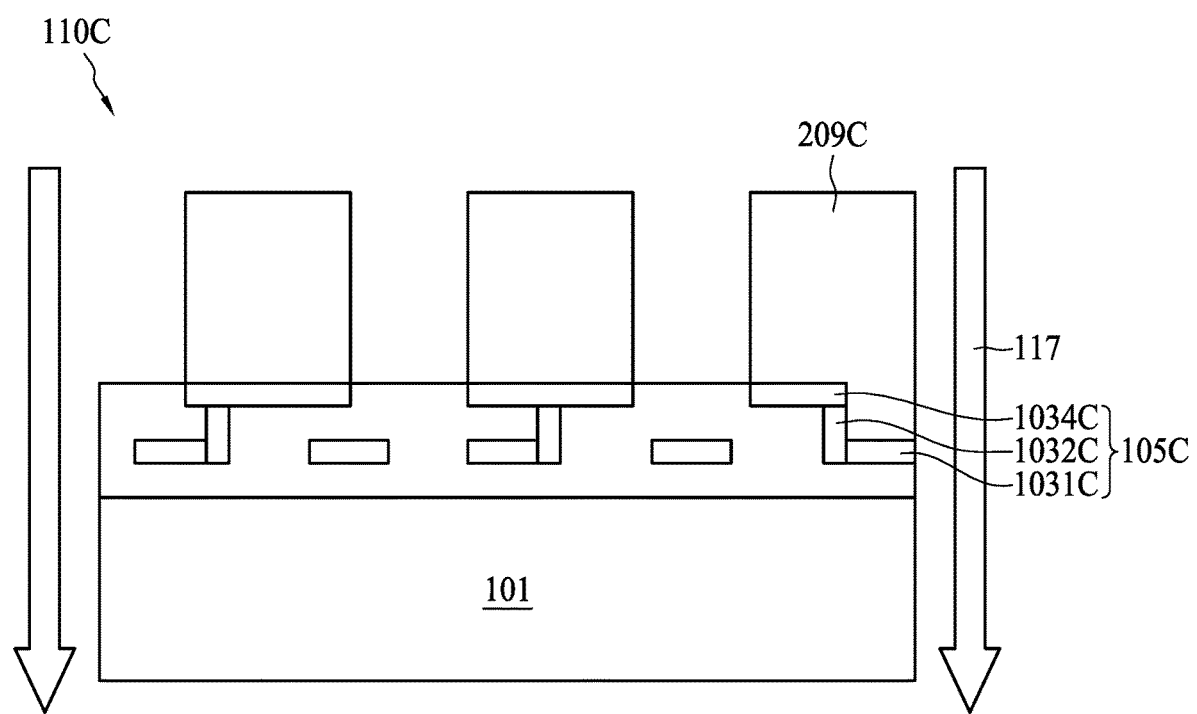

In step 507, a bumping material 209C is formed on the edge-bumping pad 105C as shown in FIG. 24. In some embodiments, the bumping material 209C includes lead-free solders, including tin, copper, and silver, or "SAC" compositions, and other eutectics that have a common melting point and form conductive solder connections in electrical applications.

Figure 25:
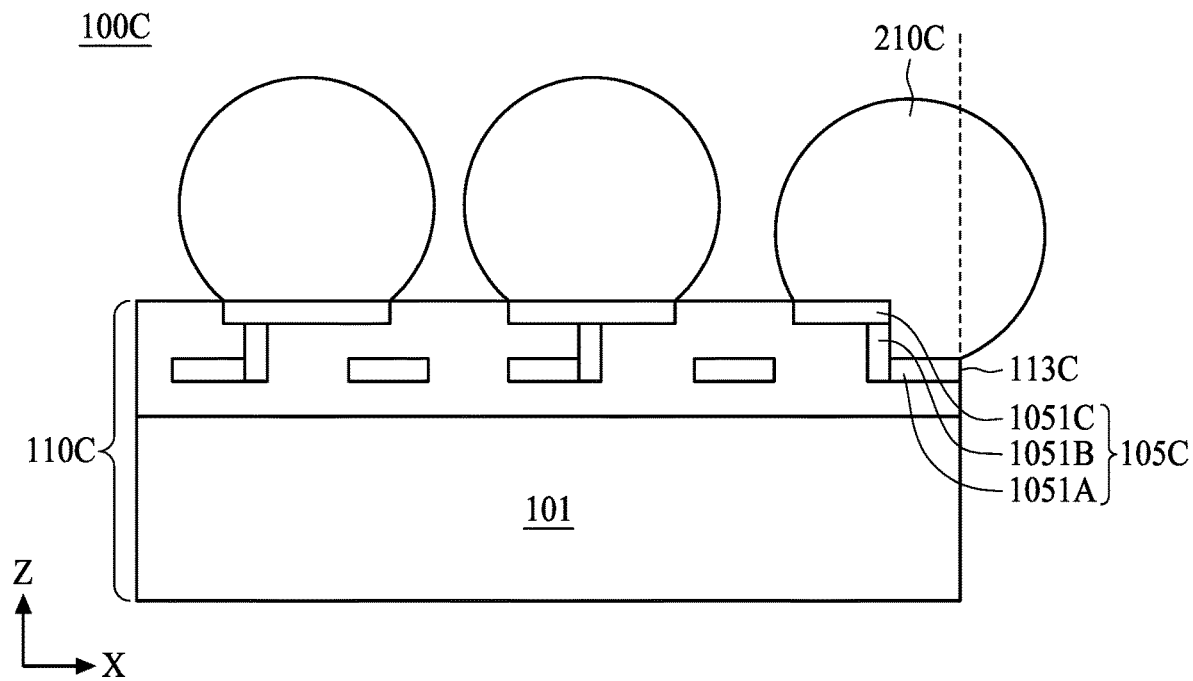

In step 509, a bump structure 210C is formed over the edge-bumping pad 105C as shown in FIG. 25. In some embodiments, the bump structure 210C is formed by performing a thermal treating process such as an infrared (IR) reflow process to the bumping material 209C. In some embodiments, the bottom of the bump structure 210C has a step bump profile facing the step pad profile of the edge-bumping pad 105C. In some embodiments, the bump structure 210C over the edge-bumping pad 105C extends laterally along the lateral direction (X-direction in the drawing) across the first side 113C of the semiconductor device 110C.

Figure 26:
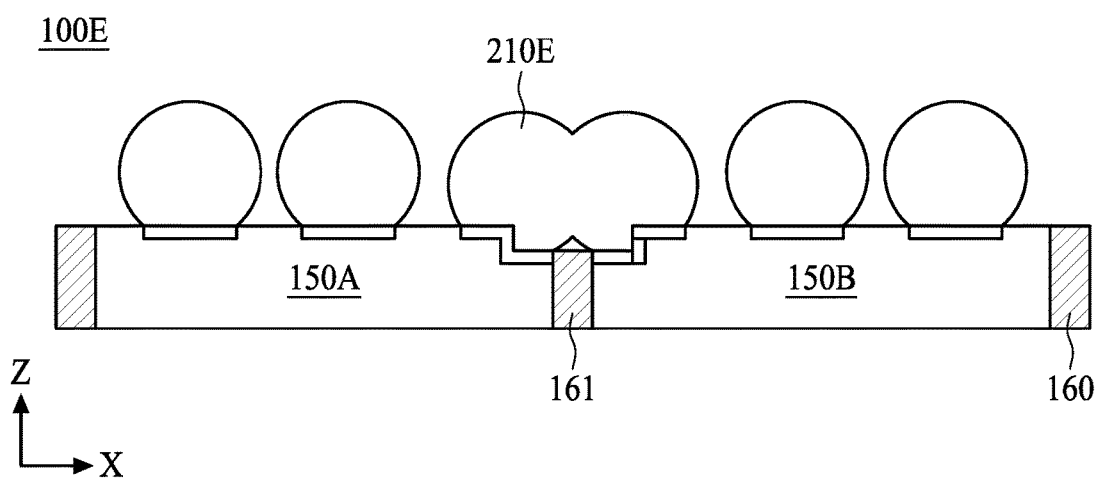

Referring to FIG. 26, in alternative embodiments, after finishing the process shown in FIG. 24, two semiconductor devices are laterally disposed and adjacent to one another, and a molding member 140 is then formed to encapsulate the two semiconductor devices. In some embodiments, the two semiconductor devices can be the semiconductor device with bumping material 209B in FIG. 18 or the semiconductor device with bumping material 209C in FIG. 24. Subsequently, a thermal treating process such as an infrared (IR) reflow process is performed to form a bump structure 210E implementing a lateral signal path between the two semiconductor devices. In some embodiments, the bump structure 210E extends laterally across the intervening portion 161 of the molding member 160 to implement a lateral signal path between the two laterally adjacent semiconductor devices.

The embodiments of the present disclosure provide a semiconductor package with a bump structure implementing the lateral signal path between the two laterally adjacent semiconductor devices in the absence of a redistribution structure. Consequently, the height of the semiconductor package of the present disclosure is less than the height of the semiconductor package with a redistribution structure. In other words, the semiconductor package of the present disclosure can meet the miniaturized scale demand (small form factor) of the semiconductor packages. In addition, the absence of the redistribution structure is a key factor in the reduction of the fabrication cost of the semiconductor package.

In some embodiments, a semiconductor package includes a first device and a bump structure disposed over the first device. In some embodiments, the first device has a first upper surface and a first side, wherein the first upper surface and the first side form a first corner of the first device. In some embodiments, the bump structure is disposed over the first upper surface and extends laterally across the first side of the first device.

In some embodiments, a method for preparing a semiconductor package includes: providing a first device having a first upper surface and a first side, wherein the first upper surface and the first side form a first corner; and forming a bump structure over the first upper surface, wherein the bump structure extends laterally across the first side of the first device.

The lateral extension of the bump structure across the first side of the semiconductor device can contact a corresponding conductor of a laterally adjacent device to implement a lateral signal path between the semiconductor device and the laterally adjacent device in the absence of a redistribution structure corresponding to the redistribution layer.

Although the present disclosure and its advantages have been described in detail, it should be understood that various changes, substitutions and alterations can be made herein without departing from the spirit and scope of the disclosure as defined by the appended claims. For example, many of the processes discussed above can be implemented through different methods, replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A method for preparing a semiconductor package, comprising:
   providing a first device having a first upper surface and a first side, wherein the first upper surface and the first side form a first corner;
   forming a conductive contact pad having a step pad profile in the first device; and
   forming a bump structure over the first upper surface, wherein the bump structure extends laterally across the first side of the first device, and the bump structure has a step bump profile facing the step pad profile of the first device.

2. The method for preparing a semiconductor package of claim 1, comprising:
   forming a second upper surface and a second side in the first device, wherein the second upper surface and the second side form a second corner of the first device; and
   forming the bump structure over the second upper surface and extending laterally across the second side of the first device.

3. The method for preparing a semiconductor package of claim 2, wherein the first upper surface and the second upper surface are fixated at different levels, and the bump structure extends vertically from the first upper surface to the second upper surface of the first device.

4. The method for preparing a semiconductor package of claim 1, comprising:
   forming a missing corner in the first device; and
   forming the bump structure over the first upper surface and filling the missing corner.

5. The method for preparing a semiconductor package of claim 1, further comprising:
   providing a second device laterally adjacent to the first device, wherein the second device comprises a second upper surface and a second side, and the second upper surface and the second side form a second corner of the second device;
   wherein the bump structure extends laterally from the first device across the second side to the second upper surface of the second device.

6. The method for preparing a semiconductor package of claim 5, further comprising:
   forming a molding member surrounding the first device and the second device, wherein the molding member includes an intervening portion between the first device and the second device;
   wherein the bump structure extends laterally across the intervening portion, and the bump structure implements a lateral signal path between the first device and the second device.

7. The method for preparing a semiconductor package of claim 5, comprising:
   forming a first missing corner in the first device and a second missing corner in the second device;
   wherein the first missing corner faces the second missing corner, and the bump structure fills the first missing corner and the second missing corner.

8. The method for preparing a semiconductor package of claim 1, comprising:
   forming a missing corner in the first device; and
   forming a conductive contact pad over the missing corner; and
   forming the bump structure over the conductive contact pad and filling the missing corner.

9. The method for preparing a semiconductor package of claim 1, comprising:
   forming a conductive contact pad in the first device, wherein the conductive contact pad comprises a first conductive layer at a first level, a second conductive layer at a second level, and a conductive via electrically connecting the first conductive layer and the second conductive layer;
   forming a missing corner exposing the conductive contact pad; and
   forming the bump structure over the conductive contact pad and filling the missing corner.

* * * * *